US010688855B1

(12) United States Patent
Moore

(10) Patent No.: US 10,688,855 B1
(45) Date of Patent: Jun. 23, 2020

(54) MECHANICAL BATTERY

(71) Applicant: David D. Moore, Orange, CA (US)

(72) Inventor: David D. Moore, Orange, CA (US)

(*) Notice: Subject to any disclaimer, the term of this patent is extended or adjusted under 35 U.S.C. 154(b) by 0 days.

(21) Appl. No.: 16/224,563

(22) Filed: Dec. 18, 2018

(51) Int. Cl.
B60K 1/00 (2006.01)
B60K 1/04 (2019.01)
H01M 2/20 (2006.01)
H01M 6/50 (2006.01)
H01M 2/10 (2006.01)
G01R 31/3835 (2019.01)
H01M 10/42 (2006.01)

(52) U.S. Cl.
CPC ............ *B60K 1/04* (2013.01); *G01R 31/3835* (2019.01); *H01M 2/1083* (2013.01); *H01M 2/206* (2013.01); *H01M 6/5083* (2013.01); *H01M 10/425* (2013.01)

(58) Field of Classification Search
CPC . B60K 1/04; B60K 6/48; B60K 6/105; B60K 6/00; B60K 6/445
See application file for complete search history.

(56) References Cited

U.S. PATENT DOCUMENTS

| | | | |
|---|---|---|---|
| 2011/0238244 A1* | 9/2011 | Sah .................. | B60K 6/445 701/22 |
| 2011/0270489 A1* | 11/2011 | Gustmann ........... | B60L 3/0007 701/36 |
| 2012/0262105 A1* | 10/2012 | Atkins ............... | B60K 6/00 320/103 |
| 2013/0042617 A1* | 2/2013 | Atkins ............... | B60K 6/105 60/698 |
| 2014/0103761 A1* | 4/2014 | Atkins ............... | B60K 6/105 310/74 |
| 2016/0311325 A1* | 10/2016 | Lieu .................. | B60L 11/16 |
| 2017/0151884 A1* | 6/2017 | Khosravi ............ | B60K 6/48 |

* cited by examiner

*Primary Examiner* — Hau V Phan

(57) ABSTRACT

An energy storage system may include an internal battery. Further, the energy storage system may include a motor electrically coupled to the internal battery. Further, the energy storage system may include an alternator rotatably coupled with the motor. Further, the energy storage system may include a primary battery electrically coupled to the alternator. Further, the energy storage system may include a voltage sensor configured for sensing a voltage level of the primary battery. Further, the energy storage system may include a switching device electrically coupled to each of the internal battery and the motor; and, may be configured for controlling electrical connectivity between the internal battery and the motor based on the voltage level of the primary battery. Further, the energy storage system may include an electrical interconnect electrically coupled to one or more of the internal battery, the alternator and the primary battery.

19 Claims, 6 Drawing Sheets

MECHANICAL BATTERY

FIELD OF THE INVENTION

The present disclosure relates generally to batteries. More specifically, the present disclosure describes a mechanical battery.

BACKGROUND OF THE INVENTION

Means of storage and use of electrical energy have increased, evolved, and improved. Existing batteries generally employ an internal application triggering a chemical reaction to generate a flow of electrons which may then be drawn upon for external use.

Further, most portable electrical devices now use batteries as a source of power for operation. However, when a charge in a battery operating a device is depleted, the battery must be replaced.

Further, rechargeable batteries also exist. However, such batteries may also need to be plugged in to an external power source to recharge and replenish the charge level of the batteries.

Environmentally-friendly batteries that may employ internal mechanical applications to efficiently and cleanly generate a flow of electrons/charge; which may then be stored to be drawn upon for external use, do not yet exist. Further, batteries that may employ internal mechanical applications for recharging without significant loss of power do not yet exist.

Therefore, there is a need for improved environmentally-friendly, mechanical batteries that may overcome one or more of the above-mentioned problems and/or limitations.

SUMMARY OF THE INVENTION

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

According to some embodiments, an energy storage system is disclosed. The energy storage system may include an internal battery configured for converting an input electrical energy into a stored chemical energy. Further, the energy storage system may include a motor electrically coupled to the internal battery for converting electrical energy into mechanical energy. Further, the energy storage system may include an alternator rotatably coupled with the motor configured for generating at least a portion of the input/electrical energy. Further, the energy storage system may include a primary battery configured for converting a primary electrical energy into a primary stored chemical energy. Further, the primary battery may be configured for converting the primary stored chemical energy into a primary output electrical energy. Further, the primary battery may be electrically coupled to the alternator. Further, the energy storage system may include a voltage sensor electrically coupled to the primary battery and configured for sensing a voltage level of the primary battery. Further, the energy storage system may include a switching device electrically coupled to each of the internal battery and the motor and may be configured for controlling electrical connectivity between the internal battery and the motor based on the voltage level of the primary battery. Further, the energy storage system may include an electrical interconnect electrically coupled to one or more of the internal battery, the alternator and the primary battery. Further, the electrical interconnect may be configured to electrically interface with an electricity consuming device in order to supply electrical energy to the electricity consuming device.

Both the foregoing summary and the following detailed description provide examples and are explanatory only. Accordingly, the foregoing summary and the following detailed description should not be considered to be restrictive. Further, features or variations may be provided in addition to those set forth herein. For example, embodiments may be directed to various feature combinations and subcombinations described in the detailed description.

BRIEF DESCRIPTION OF THE DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

DETAILED DESCRIPTION OF THE INVENTION

Figure 1:
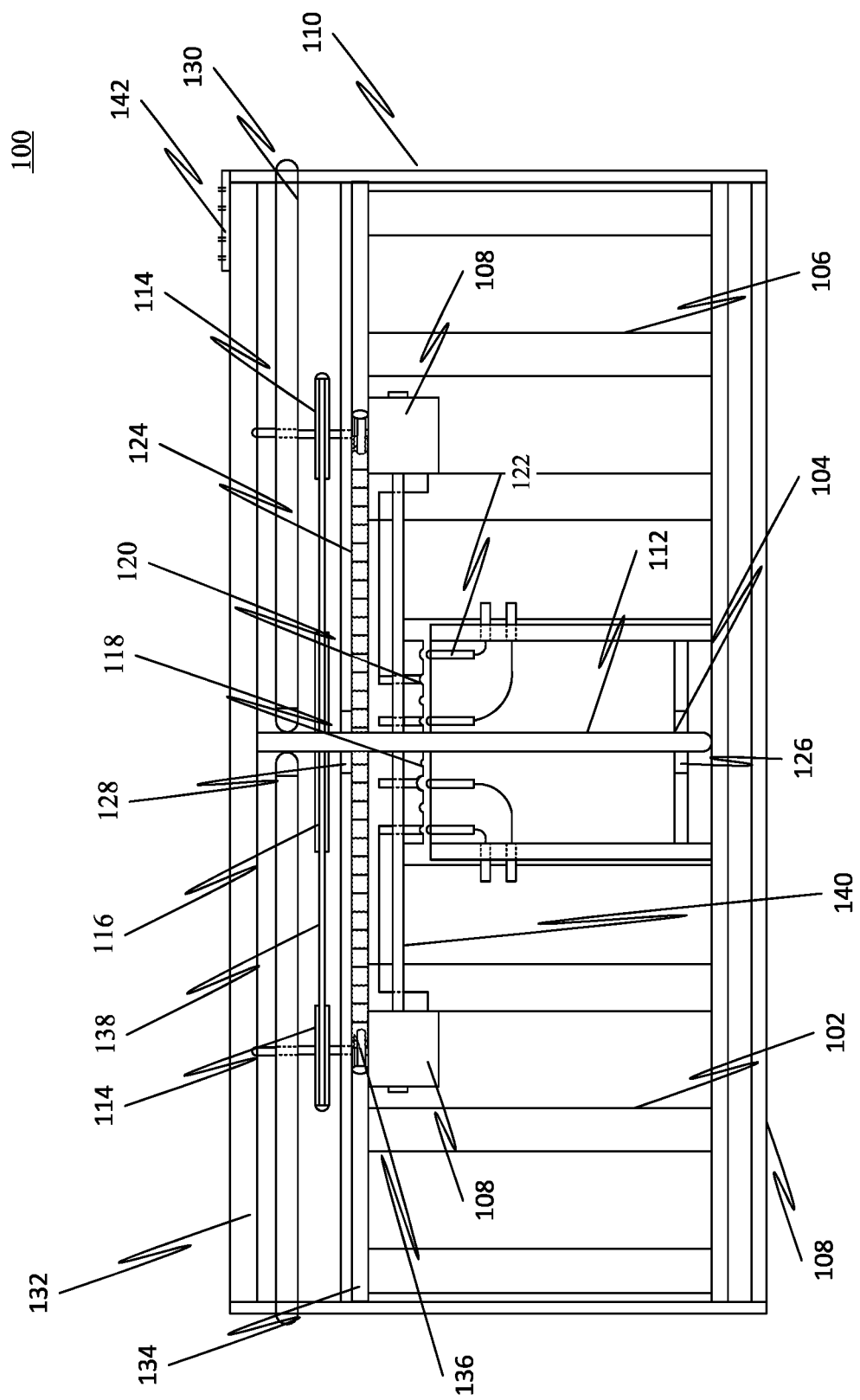
FIG. 1 shows as a through-view of an exemplary construction of a mechanical battery consistent with various embodiments of the present disclosure.

All illustrations of the drawings are for the purpose of describing selected versions of the present invention and are not intended to limit the scope of the present invention.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present disclosure. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of energy storage, embodiments of the present disclosure are not limited to use only in this context.

OVERVIEW

In accordance with some embodiments, a battery that may employ an internal "mechanical application" to generate a flow of electrons, which may then be stored to be drawn upon for an external use, is disclosed. In an instance, the battery may be named as dmoore battery, or mechanical battery. Once the dmoore battery is no longer physically capable of holding a charge (the lifespan of the battery—without the need of constant/any "external" charging) the dmoore battery may possess an ability to continuously output electricity. In an instance, the dmoore battery may output electricity in the range of 54 volts to 72 volts.

The dmoore battery may include a primary battery to be drawn upon for external use capable of holding a significant amount of charge such as 72 volts. Further, the dmoore battery may include an internal use battery, such as a 24-volt battery to charge, through a mechanical application, the primary battery when the primary battery is detected to be depleted to a defined level. When the primary battery becomes depleted by a pre-determined amount (for e.g. if the primary battery is a 72 volt battery, and is depleted by 25 percent and carries a reduced charge of now 54 volts battery) a voltage sensor may detect this drop in voltage. Further, the voltage sensor may open a gate, between the internal battery and a winch motor, and may command the winch motor to begin drawing charge from the internal battery required for the operation of the winch motor. Further, the voltage sensor (once the voltage in the primary battery is detected to be charged) may close the gate (between the internal battery and the winch motor) and may command the winch motor to cease drawing charge from the internal battery required for the operation of the winch motor. Further, until a certain, and definitive point in time when the primary battery is no longer physically capable of holding a charge, a repetition of a cycle of depletion by 25% of capacity which may triggers the opening of the gate between the internal battery and the winch motor may continue.

Further, a secondary alternator, which may be a part of an internal closed loop may be placed in operation/rotation. In an instance, the secondary alternator may be one of a plurality of secondary alternators mounted to a spindled alternator, which may be rotated by the winch motor. Further, one or more of the plurality secondary alternators mounted to the spindled alternator may provide a greater flow of electrons to the internal battery than the high-torque motor may be capable of drawing. Further, one or more of the secondary alternators mounted to the spindled alternator may be thought of as stragglers (byproducts of a closed loop having been opened; i.e. of the spindled alternator having been placed in rotation), wherein one or more of the plurality of secondary alternators may provide a flow of electrons required to maintain the ability of the primary battery to continuously output, such as 54 to 72 volts of electricity.

The dmoore battery may be able to output a vast and continuous amount of electricity, and may also incorporate a principle of side-loading a spindled mass (spindled alternator, as described herein) with a plurality of equally spaced secondary alternators (single-wire alternators with built-in voltage regulators), wherein once the spindled alternator/spindled mass is set in motion/rotation, inertia (kinetic energy) accrued/possessed by the plurality of individually mounted secondary alternators may be then applied to the spindled alternator continuously rotate the spindled alternator at a predefined torque, such as at 750 rpm.

Further, a combined energy possessed/accrued by the plurality of secondary alternators having been placed in motion/rotation may not be equal or greater than the energy required to continuously rotate the spindled alternator at 750 rpm. However, combining the energy provided by the plurality of secondary alternators having been placed in motion/rotation with energy produced/provided through operation of a "high-torque" electric winch motor may produce energy equal or greater than the energy required to continuously rotate the spindled alternator at 750 rpm.

Further, if the energy of the "high-torque" electric winch motor combined with the inertia produced/provided as a product of the plurality of secondary alternators having been placed in motion/rotation is equal or greater than the energy required to continuously rotate the spindled alternator at 750 rpm, one of a plurality of secondary alternators may be dedicated for the charging of the internal battery, while a remaining number of the plurality of secondary alternators may be used for the charging of the primary battery.

Further, direct current may be generated due to an ability of direct current to be stored in batteries. In an embodiment, alternating current may be generated.

Further, a transfer tower may be used to transfer the energy generated from the spindled alternator (a moving location) to the primary battery and the secondary battery (at a fixed location).

Accordingly, a closed loop consisting of an internal 24 volt battery, high-torque motor, the spindled alternator i.e. a plurality of secondary alternators may be created and opened that may operate until failure of any one of the aforementioned components. Further, the dmoore battery may include a gate (voltage sensor/switch) between the high-torque motor and the internal battery that may, when tasked to do so, open and close the closed loop.

Further, as shown in FIG. 1, an exemplary construction of the dmoore battery 100 may require an enclosure 110 which may provide for the storage of a plurality of batteries (such as an internal battery 102 and a primary battery 106) while providing a mechanical application that may facilitate a continuous operation/rotation of a plurality of secondary alternators 108 i.e. a spindled alternator 104. Further, the enclosure 110 may be incorporated into the design of pre-existing mechanisms or machines, such as inside chassis of cars or hulls of boats. Accordingly, the dmoore battery 100 may not require the dedicated enclosure 110.

In an instance, the spindled alternator 104 may be a 20 inches tall platform from which a plurality of secondary alternators 108 may be mounted in an upright position extending a distance of 10-12 inches from a spindle 112 (center shaft/1 inch all-thread). In an instance, pluralities of secondary alternators 108 are equally spaced around a periphery of a desired tracking diameter.

Further, in an embodiment, the tracking diameter may be determined by a distance of outer/leading/working edge of operating/drive sprockets 136 of the plurality of secondary alternators 108) to a center of the spindle 112 (where following a radius of the tracking diameter each secondary alternator may, for operation, track/orbit around the desired tracking diameter i.e. to be driven/operated directly).

Further, each drive pulley of a plurality of secondary alternators 108 may be replaced with a 3 inch dia. gear/planetary gear/or the sprockets 136, such as of a 3 inch diameter.

Further, a bottom end of the spindle 112 may have a radius of ½ inches, where the total mass/weight of the spindled alternator 104 may be centered/balanced. Further, balancing the total mass of the spindled alternator 104 on endpoint of the spindle 112 may be useful to maintain continuous rotation of the spindled alternator 104 at 750 rpm.

In an embodiment, the spindled alternator may be built using a plurality of secondary alternators 108. Further, drive pulleys of the plurality of secondary alternators 108 may be replaced with a gear, a planetary gear, or a sprocket 136. Further, the spindle 112 of the spindled alternator 104 may be of a length of 20 inches, and may be fabricated of 1 inch all-thread. Further, a ½ inch radius endpoint may be left at a bottom end of the spindle 112. Further, the spindled alternator 104 may include an alternator mounting plate 140. Further, the alternator mounting plate 140 may be fabricated from a steel plate, such as of a thickness of ⅜-½ inches. Further, the weight/mass of the alternator mounting plate 140 may aid in building kinetic energy. The alternator mounting plate 140 may be circular in shape. In an instance, the diameter of the alternator mounting plate 140 may be 30 inches. Further, a plurality of holes, such as of a diameter of 5¾ inches may be cut into the alternator mounting plate 140. The plurality of holes may be equally spaced and located at a same radial distance from the center of the alternator mounting plate 140, such as at a distance of 10-12 inches. The plurality of holes may be used to seat the plurality of secondary alternators 104 (with a top portion of the plurality of secondary alternators being exposed). Further, a center-hole of a desired diameter, such as 1 inch, may be drilled and tapped. Further, the alternator mounting plate 140 may be threaded (from the bottom of the spindle 112) to a position where once the plurality of secondary alternators 108 are mounted in a backside down and a gear up orientation would leave the sprocket 136 of the plurality of secondary alternators 108 at a desired height; such as an elevation of 14 inches to match an elevation of an upper-shelf 134 (lower) of a 24 inch diameter tracking chain/ring gear 124.

Further, the combined mass of the alternator mounting plate 140 and the plurality of secondary alternators 108, alone, may not provide optimal mass. In order to optimize the gross weight of the spindled alternator 104 (to provide a greater amount of kinetic energy) mass may needed to be added. This added weight/mass may be located (mounted to the alternator mounting plate 140) beyond the tracking diameter of the plurality of secondary alternators 108 where, an increased distance beyond the tracking diameter may provide greater kinetic energy. Further, the kinetic energy may be applied to the energy required to operate each of the plurality of secondary alternator 108.

Additionally, a primary source of energy needed to initiate and continuously rotate/operate the spindled alternator 104 may be provided through the operation of a 24 volt (direct current) high-torque motor. Further, high-torque motor may be used to refer to the winch motor, and, may be used interchangeably henceforth. Further, the high-torque motor 204 may be a 10,000 lb. capacity winch motor or larger.

Further, the high-torque motor may be modified to accept/drive a standard v-belt drive pulley 116. Further, the high-torque motor may have a high-torque and a low rpm.

Further, the spindled alternator 104 may include a contact plate/lolly-plate 118. Further, the contact plate 118 may be fabricated using a piece of wood/non-conducting material (1 inch thick) cut into a circle measuring 10-12 inches in diameter, where, a 1 inch diameter center hole may be drill and tap. Further, depending on the plurality of secondary alternators 108 to be mounted; routed into the contact plate 118 may be a corresponding number of 5/16 radius (½ inch deep) circles. Further, a first router circle may be located in a position 2 inches from center with each preceding router circle to be located 1 inch on center (of the preceding router circle) leaving a ⅜ wide space of wood/non-conductive material between each router circle. Further, ⅜ inch diameter through holes (1 per router circle) may be required to provide for allowance of contact rings 120 connection post.

Further, the contact plate/lolly plate 118 may be slid up (from the bottom of the 1 inch diameter spindle 112) until the contact plate/lolly plate 118 may rest tightly against the alternator mounting plate 140, where, once in place; the pre-drilled 1 inch diameter holes (1 per router circle) may be used to "through drill" a plurality of corresponding holes through the alternator mounting plate 140.

Further, depending on the plurality of secondary alternators 108 to be mounted (the total number of router circles) ⅝ inch diameter (half round) copper tubing with a 0.060 sidewall may be roll/form providing a corresponding number of contact rings 120 equal in size to each routed circle; where, once each contact ring 120 has been formed a ⅜ thick copper electrical connecting/terminal post (2 inches in length—one each to connect the plurality of secondary alternators 108 to the plurality of contact rings 120) may be solder/welded in place (perpendicular to the contact rings 120 sitting flat).

Further, each contact ring 120 may be secured/epoxied into corresponding router circles (posts extending through).

Further, the contact plate 118 (with copper contact rings 120) may be re-mounted to the underside of the alternator mounting plate 140 (tabs extending through).

Further, the plurality of secondary alternators 108 may interconnect to the plurality of corresponding copper connection post.

Further, the enclosure 110/casing may have dimensions of 48 inches of length, 32 inches of depth, and 25 inches of height, and, may provide for storage for multiple batteries, and, provide the mechanical application required for continuous rotation of the spindled alternator 104.

When viewed from the side (a through view) a bottom (base) measuring 48 inches wide (32 inches deep), in which a steel 1½ inch cup/shoe (1 inch thick with inside machined 9/16 inch radius with a depth of ½ inch) may be visible.

Along with the multiple number of stored batteries, mounted to the base (centered) may be a transfer/terminal tower (11¼ inches tall and 10-12 inches wide) where individual pick-ups 122 (electrical/one per each secondary alternator 108) may be connected to an individual (terminal tower/side mounted) lead/terminal post, which may then transfer electricity being generated to fixed locations of the batteries.

Further, the pick-ups 122 (which may individually align with each individual copper contact-ring 120 inserted within the contact/lolly plate 118) may be PVC/sleeves containing a ½ inch diameter ball/brush (electrically conductive) and springs (electrically conductive) with low gauge #8 lead wires which may attach to a plurality of individual terminal posts; from which lead wires may run to the fixed location of both the internal battery 102 and the primary battery 106.

Further, a 1 inch (inside diameter) roller bearing 126 may provide alignment of the spindled alternator 104; and may be centered (elevated 1 inch above bottom/base) within the transfer tower.

Additionally, due to a total weight/mass of the spindled alternator 104 and the plurality of batteries (200-300 lbs.) the base may be made sturdy, such as using inch and a half solid oak sandwiched between two pieces of (due to its hard flat surface) ¾ thick melamine, such as measuring 48×32 inches.

Further, in addition to a top plate/lid 132 an upper shelf 134 creating a 3 inch opening between the top plate/lid 132 and upper shelf 134 may be visible. Further, the upper shelf may be fabricated using 2 sheets (48×32) ¾ thick melamine, where, a lower half may have a 27 inch round cut-out lined with a roller chain. Further, in the center of the upper half of the top shelf 134 may be centered a round cut-out which may include a second (1 inch inside diameter) roller bearing 128. Extending through the second roller bearing 128 may be the top 4 inches of the 1 inch diameter spindle 112 of the spindled alternator 104, which may be pinched between 2 opposing flywheels 130 of 24 inch diameter, horizontally sandwiched between the upper shelf 134 and the top plate/lid 132. Further, the 2 opposing flywheels 130 (which may require an ability to free-wheel when not being driven) may be mated with 6 inch diameter standard V-belt pulleys 114. Further, the 2 opposing flywheels 130 may be rimmed with an inflatable rubber tire to aid in the continuous rotation of the spindled alternator 104 at 750 rpm.

Due to a centrifugal force, tension/stress may be generated in a lateral direction (downward stress may be minimal), and the upper shelf (creating a lower chamber) may be separated by a plurality of schedule 40 PVC struts/supports encompassing the tracking diameter (26 total, and 13.5 inches in length). Further, due to the criticality of perpendicularity, the struts may be inner-lined with 1 inch thick wood dowels with ½ inch diameter center holes/held in place using ½ inch diameter all-thread secured from the base (underside) as well as the upper shelf (topside).

Further, mounted to a bottom side of the upper shelf 134 may be centered a 26 inch (inside diameter) ring-gear or a roller chain 124 (depending on a method to be used), creating the desired tracking diameter. Further, the sprockets 136 of the plurality of secondary alternators 108 mounted onto the spindled alternator 104 may be seated/meshed with-in the upper shelf 134 (lower) ring-gear/roller chain 124; where, the plurality of secondary alternators 108 may be allowed to spiral for operation, thereby allowing the sprocket 136 to make 8 operational revolutions per each single revolution of the spindled alternator 104.

Further, as efficiency of the alternators may be related to a temperature of their environment, the lower chamber may be enclosed using a 3 sided wrap made of perforated aluminum (providing air-flow) and a single (solid) sidewall (bulkhead 48×20×1½ inches used to center mount the high-torque motor.

Further, the high-torque motor (DC 12-24 volt) may be vertically center mounted, (modified to drive a 16 inch diameter standard V-belt pulley) to an outside portion of bulkhead sidewall. Further, the high-torque motor may not directly drive/rotate the spindled alternator 104; rather, the high-torque motor may drive the 16 inch standard V-belt pulley 116 which may be looped by a belt (industrial "V" belt 138) with the operating/drive pulleys 114 of the 2 (24 inch dia.) opposing flywheels 130 (where the spindle 112 may be pinched between the 2 opposing flywheels 130). Further, the high-torque motor may rotate at a rate approximate to 15 rpm. Further, the top plate/lid 132 may measure 48×32×1½ inches thick. Further, due to a hard flat surface, together 2 pieces of ¾ inches thick melamine may be joined for both the top plate/lid 132 and the upper shelf 134, as well as the bulkhead. Further, mounted outside the enclosure 110 may be located a power converter 142 that may convert the energy stored in the primary battery 106 to be used as alternating current.

Figure 2:
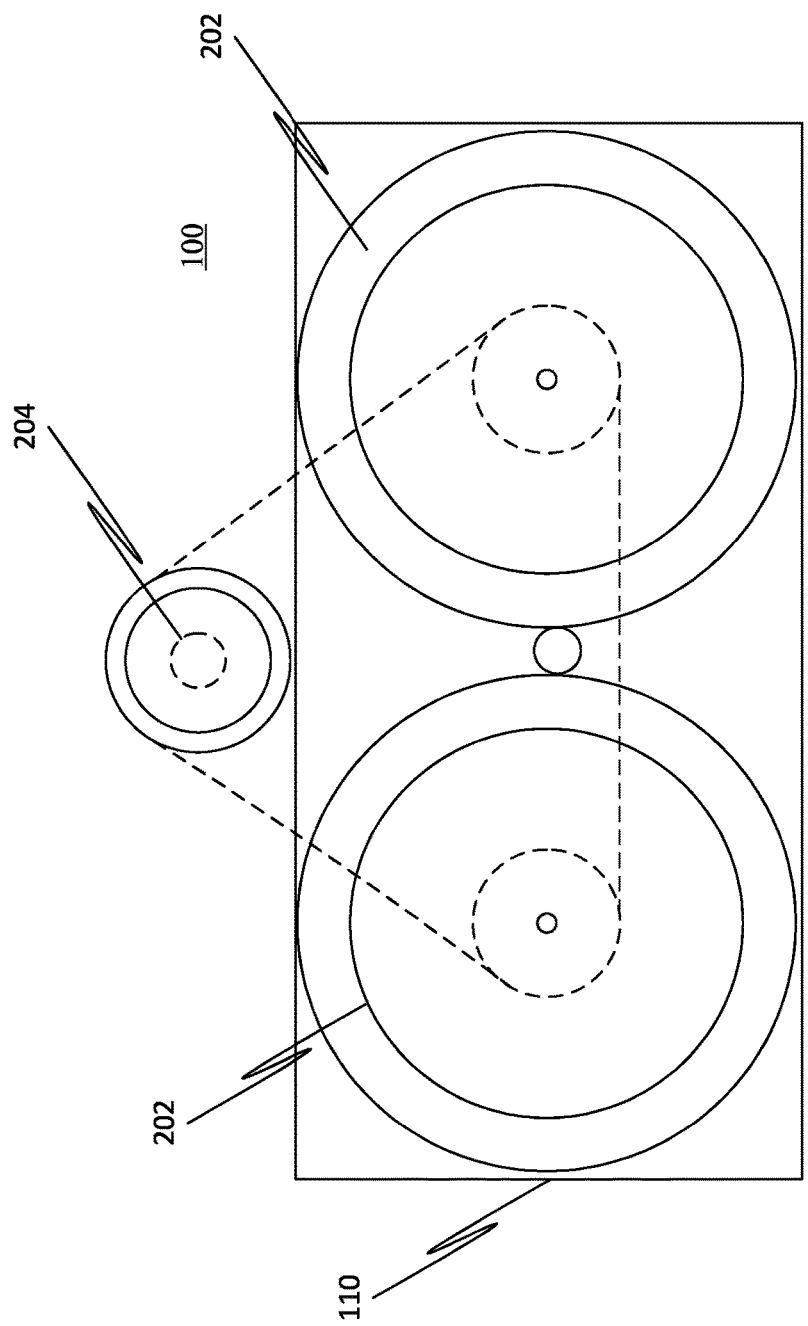
FIG. 2 shows a top view of the construction, in accordance with some embodiments.

Further, as shown in FIG. 2, to construct a dmoore battery, such as the dmoore battery 100, a spindled alternator 104 may be mounted with 4 secondary alternators with built-in voltage regulators and a total gross weight of 120 lbs. providing a centrifugal force equal to 30 lbs. per individual alternator mounted. Further, located in the lower chamber of the dmoore battery 100 open spaces may exist to a left and right side of the spindled alternator 104 where a total of eight 12 volt deep-cycle/marine type batteries may be stored. Further, 6 of the 8 batteries may be connected (in series) to create a single 72 volt deep-cycle, chargeable battery (primary battery 106) which may be then converted to alternating current and drawn upon for external use. Further, the remaining 2 of the 8 batteries may be connected (in series) to create a single chargeable 24 volt deep-cycle battery (the internal battery 102) tasked to operate a high-torque motor 204 providing for the continuous operation/rotation of the spindled alternator 104.

Figure 4:
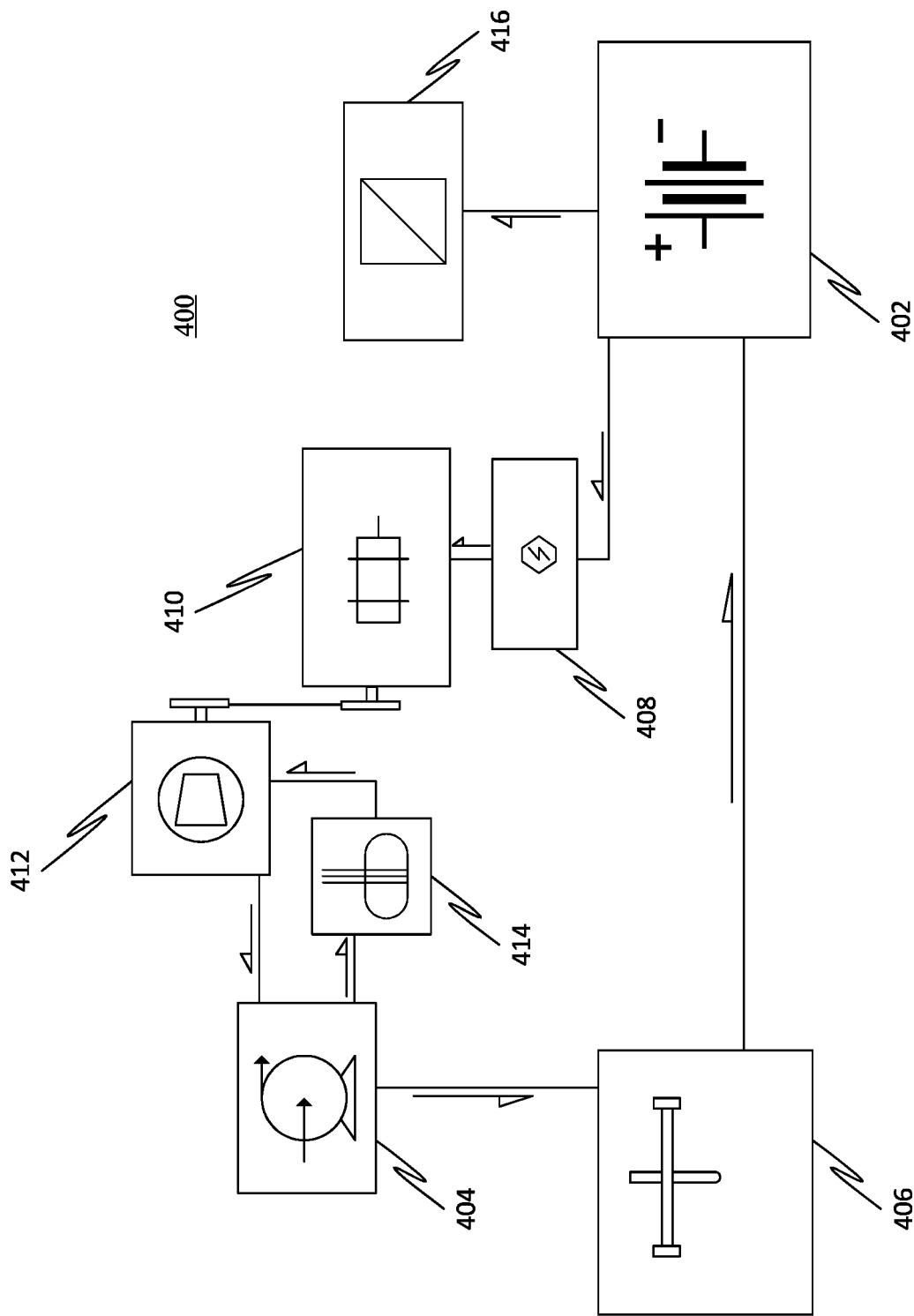
FIG. 4 shows an exemplary mechanical battery, in accordance with some embodiments.

When the primary battery 106 becomes depleted by a pre-determined amount (for e.g. if the primary battery 106 is a 72 volt battery, and is depleted by 25 percent and carries a reduced charge of now 54 volts battery) a voltage sensor 408 (as shown in FIG. 4) may detect this drop in voltage. Further, the voltage sensor 408 (as shown in FIG. 4) may open a gate and may command the high-torque motor 204 to begin drawing charge from the internal battery 102 required for the operation of the high-torque motor 204. Further, a secondary lone alternator of the plurality of secondary alternators 108 may be placed in operation/rotation and dedicated to providing a greater amount of energy to the internal battery 102 than which could be consumed by the high-torque motor 204. Further, one or more of a plurality of secondary alternators 108 may be thought of as stragglers (byproducts of the spindled alternator having been placed in rotation/i.e. of gate having been opened), wherein, one or more of the plurality of secondary alternators 108 may provide a flow of electrons required to the maintain the ability of the primary battery 106 to continuously output, such as 54 to 72 volts of electricity. Further, once the primary battery 106 is fully charged, the voltage sensor 408 may signal the high-torque motor to rest/stop. The dmoore battery 100 may repeat this cycle until a certain and particular point in time at which the batteries may no longer be physically capable of holding a charge.

Further, the dmoore battery 100 may be implemented within electric vehicles, such as electric cars or electric boats. For instance, an electric vehicle may possess an onboard ability to continuously operate the plurality of secondary alternators 108 i.e. the spindled alternator 104. For instance, the spindled alternator 104 may be mounted with 4 secondary alternators 108 with built-in voltage regulators, with a gross weight of 120 lbs./30 lbs. force per secondary alternator. Starting with 8 new 12 volt deep-cycle/marine type batteries, 6 of the 8 batteries may be connected in series creating a single 72 volt deep-cycle re-chargeable battery pack which would then be used to power the one or more types of vehicles. Further, the remaining 2 of 8 batteries may be connected in series to create a single 24 volt battery pack which may be used to operate the high-torque motor providing the continuous operation/rotation of the spindled alternator 104. Further, while the electric vehicle is in operation, should the 72 volt battery pack become depleted below 20%, the voltage sensor 408 may detect the depletion and signal the high-torque motor 204 to begin a continuous rotation of the spindled alternator 104 providing the continuous operation of each individually mounted secondary alternator, where, one of the plurality of secondary alternators 108 may be dedicated to continuous charging of the 24 volt battery pack 102 providing for the operation of the high-torque motor 204. Further, the 3 remaining secondary alternators 108 may then be tasked with continuous charging of the 72 volt battery pack. Further, once the 72 volt battery pack is fully charged, the voltage sensor 408 may signal the high torque motor 204 to rest/stop. Accordingly, the electric vehicle may be automatically charged. Further, the electric vehicle may not require a transmission system as speed of the electric vehicle may be controlled by a voltage regulator, further; a reverse of direction may be achieved by reversing the polarity of the drive motor.

Further, due to an inherent ability to configure the spindled alternator 104 in a manner as would be desired, a total number of alternators 108, a rate of rotation, and total gross weight in an implementation may be reflective of an optimal setup to a particular design. Further, due to the recharging mechanism being mechanical, kinetic energy produced per individual alternator 108 (through centrifugal force) may be calculated/manipulated precisely.

For instance, if the spindled alternator 104 has a 4-alternator mount, a gross weight of 100 lbs., a tracking diameter of 20-24 inches, and a rotational speed of 42 mph/600 rpm, the centrifugal force alone (kinetic energy) may provide each secondary alternator 108 mounted to the spindled alternator 104 with a force equal to a 25 pound object traveling at a constant rate approximate to 42 mph/600 rpm. Further, in another instance, the spindled alternator 104 along with 4 secondary alternators 108 and a gross weight of 120 lbs. may provide a centrifugal force (kinetic energy) equal to 30 lbs. per each secondary alternator mounted to the spindled alternator 104. Further, in another instance, 5 secondary alternators may be used with the spindled alternator, with a gross weight of 100 lbs. providing a centrifugal force (kinetic energy) equal to 20 lbs. per every mounted secondary alternator 108. To determine the centrifugal force (kinetic energy provided per each secondary alternator), the total gross weight of the spindled alternator 104 may be divided by a number of the plurality of secondary alternators 108 mounted to the spindled alternator 104. Further, the plurality of secondary alternators 108 traveling at a constant rate of 42 mph @ 600 rpm may be just one example based upon pre-determination of gearing, where the 42 mph may be achieved through use of the high-torque motor 204 driving operational drive pulley 116 (of a diameter of 16 inches equaling 50.24 inches of travel per revolution) which may then drive the two opposing flywheels 202 measuring 24 inches in diameter (equaling 75.36 inches of travel per revolution) with 3 inch diameter drive pulleys 136 (9.42 circumference) pinching (interact with/rotating) a spindle 112, and a rotation speed of the high-torque motor of less than approximately 15 rpm. Simply by changing one or any of the variables/gearings, the rate of travel may be can be easily optimized.

Further, due to a tracking diameter of 20-24 inches of the spindled alternator, each operating/planetary gear may make 8 operational revolutions per each (single) revolution of the spindled alternator.

Figure 3:
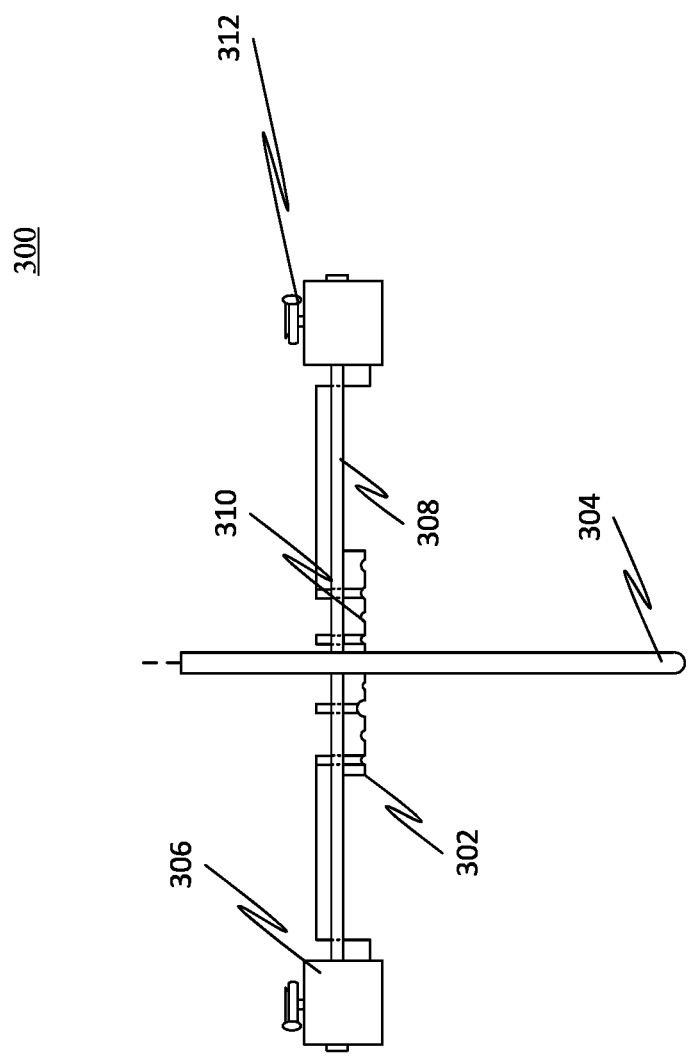
FIG. 3 shows an exemplary spindled alternator of a mechanical battery, in accordance with some embodiments.

FIG. 3 shows an exemplary spindled alternator 300, including a non-conductive contact plate 302 (lolly-plate), a 1 inch dia. spindle 304, and a plurality of single wire-alternators 306. The non-conductive contact plate 302 may be made of wood or any other non-conductive material and may be circular in shape (for e.g. with a diameter of 10-12 inches, and 1 inch thickness). Further, the non-conductive contact plate 302 may include a 1 inch diameter center hole; and a plurality of router circles of a 5/16 inches radius, corresponding to the plurality of secondary alternators 306 to be mounted. Further, each router circle may be ½ inch deep and lined with 0.060 thick copper. Further, a first route circle of the plurality of router circles may be located in a position 2 inches from the center, with each preceding router circle located 1 inch further along in a radial direction with a ⅜ inches wide space of wood/non-conductive material between each adjacent ring. Further, the non-conductive contact plate 302 may include a plurality of ⅜ inch diameter through holes (1 per router circle) to provide for allowance of contact rings 310 connection post. Further, the contact plate 302 may be firmly mounted to the underside of the spindled 304 where, each of inset router rings may be lined with 0.060 (wall thickness) copper tubing (split in half)

FIG. 4 shows an exemplary dmoore battery 400. The dmoore battery 400 may include a 96 volt battery 402 (battery pack consisting of 8 deep-cycle 12 volt car batteries). Further, the dmoore battery may include a hydraulic motor 404, and a spindled alternator 406. When the 96 volt battery 402 is depleted to a pre-determined level, such as by 40% of a total capacity, a voltage sensor 408 may detect the drop in voltage and may command a 3 hp. 110 volt (AC) motor 410 to begin/start and provide a hydraulic pressure required to operate the hydraulic motor 402 (via operation of a hydraulic pump 412 on a fluid stored in a fluid reservoir 414) required to rotate the spindled alternator 406 continuously at 750 rpm. Further, when the 96 volt battery 402 may be sensed to be charged at a satisfactory level (nearly 100%) the voltage senor 408 may command the 3 hp. 110 volt (AC) motor 410 to cease operation. Further, the spindled alternator 406 may be tasked with charging of the 96 volt battery 402. Further, the 96 volt battery 402 may be connected to a power convertor 416, which may interface with an external electrical equipment to power the electrical equipment.

Figure 5:
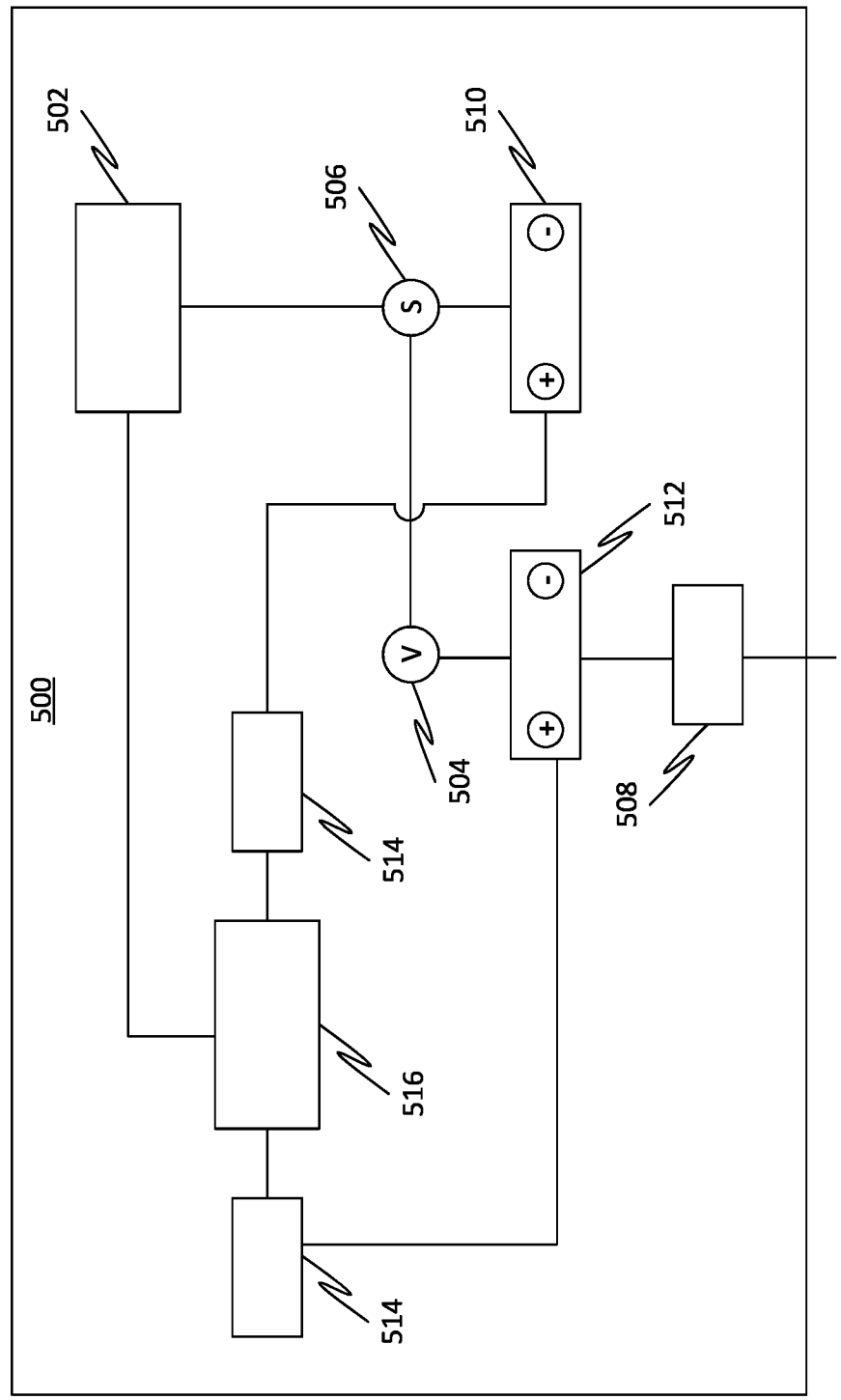
FIG. 5 shows an energy storage system, in accordance with some embodiments.

FIG. 5 shows an energy storage system 500. The energy storage system 500 may include an internal battery 510 configured for converting an input electrical energy into a stored chemical energy. Further, the internal battery 510 may be configured for converting the stored chemical energy into an output electrical energy. Further, the energy storage system 500 may include a motor 502 electrically coupled to the internal battery 510. Further, the motor 502 may be configured to be driven by the output electrical energy from the internal battery 510. Further, the motor 502 may be configured for converting electrical energy into mechanical energy. Further, the energy storage system 500 may include a spindled alternator 516 with a plurality of secondary alternators 514 rotatably coupled with the motor 502. Further, the plurality of secondary alternators 514 may be configured for generating input electrical energy. Further, the energy storage system may include a primary battery 512 configured for converting a primary electrical energy into a primary stored chemical energy. Further, the primary battery 512 may be configured for converting the primary stored chemical energy into a primary output electrical energy. Further, the primary battery 512 may be electrically coupled to the spindled alternator 516. Further, the energy storage system 500 may include a voltage sensor 504 electrically coupled to the primary battery 512. Further, the voltage sensor 504 may be configured for sensing a voltage level of the primary battery 512. Further, the energy storage system 500 may include a switching device 506 electrically coupled to each of the internal battery 510 and the motor 502. Further, the switching device 506 may be configured for controlling electrical connectivity between the internal battery 510 and the motor 502 based on the voltage level of the primary battery 512. Further, the energy storage system may include an electrical interconnect 508 electrically coupled to one or more of the primary battery 510, the spindled alternator 516 and the primary battery 106. Further, the electrical interconnect 508 may be configured to electrically interface with an electricity consuming device in order to supply electrical energy to the electricity consuming device.

In some embodiments, the motor 502 may include a Direct Current (DC) motor.

In some embodiments, the motor 502 may be characterized by a dead-pull capacity of 10,000 lb. or greater.

In some embodiments, the internal battery 510 may be configured for generating the output electrical energy at 24 Volts. Further, the primary battery 512 may be configured for generating primary output electrical energy in a range; such as between 54 to 72 Volts.

In some embodiments, the energy storage system 500 may include a spindled mass (i.e. spindled alternator 516) side-loaded with a plurality of alternators 514. Further, the plurality of alternators 514 may be equally spaced. Further, kinetic energy accrued by the plurality of alternators 514 may be applied, at least in part, to the energy required to continuously rotate the spindled alternator in conjunction with a rotatory motion imparted to the spindled alternator by the motor 502.

In some embodiments, the spindled alternator 516 further may include a plurality of sprockets corresponding to the plurality of alternators 514. Further, the plurality of sprockets may be configured for transmitting rotatory motion among the plurality of alternators 514.

In some embodiments, at least one first alternator of the plurality of alternators 514 may be configured for generating a portion of the input electrical energy for the charging of the internal battery 510. Further, at least one second alternator of the plurality of alternators 514 may be configured for charging the primary battery 512.

In some embodiments, each of the plurality of alternators 514 may include a single-wire alternator with built-in voltage regulator.

In some embodiments, each of the plurality of alternators 514 may include a voltage regulator configured to regulate an output voltage of a corresponding alternator of the plurality of alternators 514.

In some embodiments, the spindled alternator 516 may be configured for generating rotational motion characterized by 750 rpm.

In some embodiments, the spindled alternator 516 may be configured for generating electrical energy characterized by an amperage of at least 150 Amps and a rotational motion of at least 6,000 rpm.

In some embodiments, the switching device 506 may be configured for electrically connecting the motor 502 to the internal battery 510 based on the voltage level falling below a predetermined lower limit in order to operate the motor 502. Further, the switching device 506 may be configured for electrically disconnecting the motor 502 from the internal battery 510 based on the voltage level exceeding a predetermined upper limit in order to stop operation of the motor 502.

In some embodiments, the motor 502 may include a winch motor. Further, in some embodiments, the motor 502 may include a hydraulic motor.

In some embodiments, the spindled alternator 516 may include a plurality of alternators 514 mounted on the spindled alternator 516. Further, at least one first alternator of the plurality of alternators 514 may be configured for charging the internal battery 510. Further, at least one second alternator of the plurality of secondary alternators 514 may be configured for charging the primary battery 512.

In some embodiments, the energy storage system 500 may include one or more high-torque winch motors 502 configured to provide continuous rotation of the spindled alternator 516 and the plurality of alternators 514 at a predetermined rotational speed. Further, the energy storage system may include a v-belt pulley configured to transmit rotary motion from the one or more high-torque winch motors 502 to the spindled alternator 516.

Figure 6:
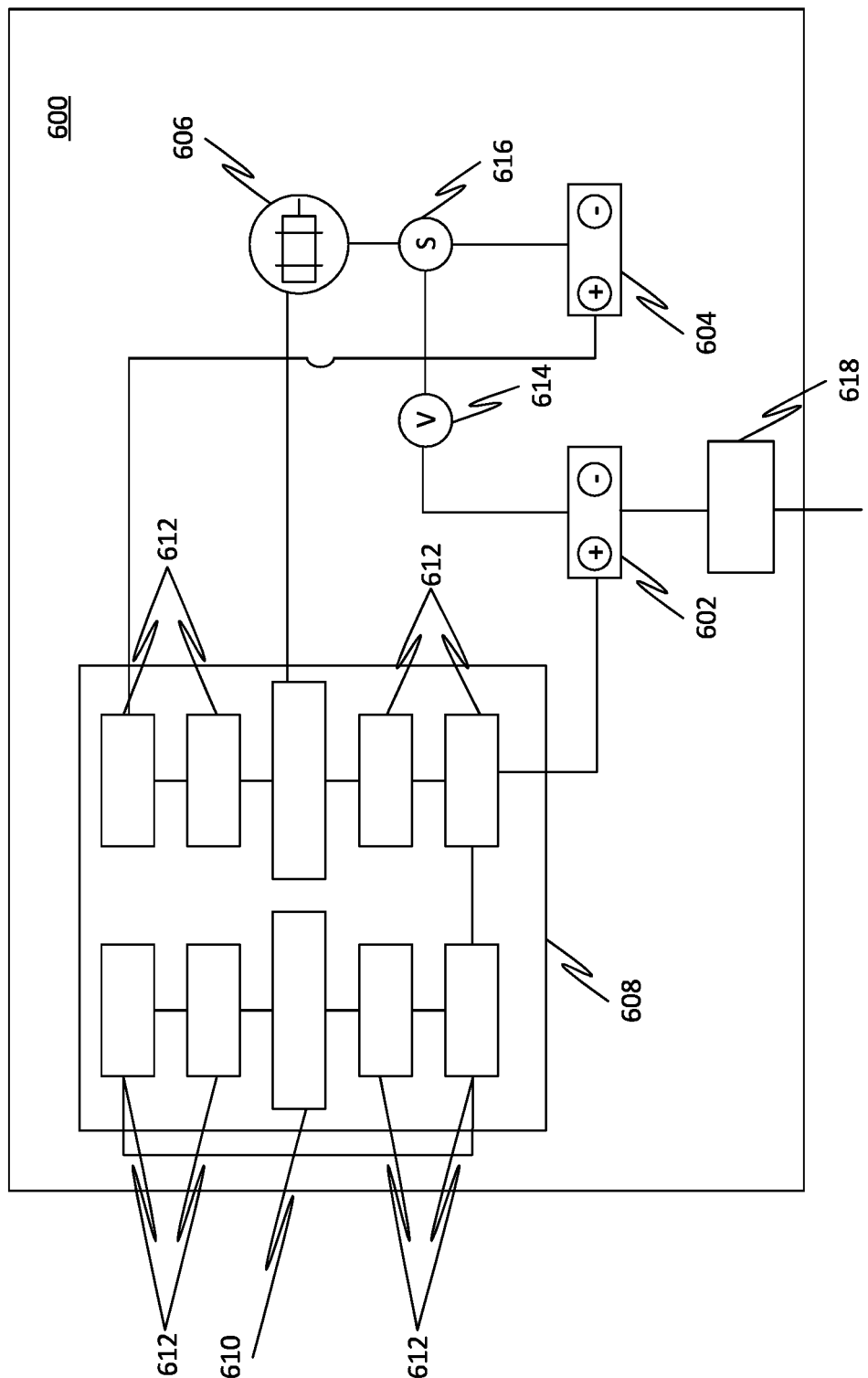
FIG. 6 shows a battery to continuously output electricity between a predetermined lower limit and a predetermined upper limit, in accordance with some embodiments.

With reference to FIG. 6, a battery 600 to continuously output electricity between a predetermined lower limit and a predetermined upper limit is disclosed. The battery 600 may include a primary battery 602 configured to output electricity between a predetermined upper and lower limit. Further, the battery 600 may include a high-torque direct current winch motor 606 configured for generating rotational motion based on the sensed electrical energy of the primary battery 602. Further, the high-torque direct current winch motor 606 may be electrically coupled to a secondary battery 604. Further, the battery 600 may include a spindled alternator 608 rotationally coupled to the high-torque direct current winch motor 606. Further, the spindled alternator 608 may include a plurality of alternators 612 configured for generating electrical energy based on rotational motion. Further, the spindled alternator 608 may be configured for rotating at a predetermined rotational speed. Further, at least one alternator of the plurality of alternators 612 may be electrically coupled to the secondary battery 604. Further, the spindled alternator 608 may include a side-loaded spindled mass mounted with four equally spaced alternators 612. Further, once spindled alternator 608 may be set into the rotational motion, the kinetic energy accrued by the plurality of alternators 612 may be applied to the energy required to continuously rotate the spindled alternator 608 at the predetermined rotational speed. Further, the battery 600 may include a voltage sensor 614 electrically coupled to the primary battery 602. Further, the voltage sensor 614 may be configured for sensing a voltage level of the primary battery 602. Further, the battery 600 may include a switching device 616 electrically coupled to each of the internal battery 604 and the high-torque direct current winch motor 606. Further, the switching device 616 may be configured for controlling electrical connectivity between the internal battery 604 and the high-torque direct current winch motor 606 based on the voltage level of the primary battery 602. Further, the battery 600 may include an electrical interconnect 618 electrically coupled to one or more of the primary battery 602, the spindled alternator 608, and the secondary battery 604. Further, the electrical interconnect 618 may be configured to electrically interface with an electricity consuming device in order to supply electrical energy to the electricity consuming device.

In some embodiments, the predetermined lower limit may be 54 volts, the predetermined upper limit may be 72 volts and wherein the predetermined rotational speed may be 750 rpm.

In some embodiments, the plurality of alternators 612 electrically coupled to both the secondary battery 604 and the primary battery 602 may include single-wire alternators with built-in voltage regulator.

In some embodiments, the spindled alternator 608 further may include a plurality of sprockets corresponding to the plurality of alternators 610. Further, the plurality of sprockets may be configured for transmitting rotatory motion among the plurality of alternators 612.

Although the invention has been explained in relation to its preferred embodiment, it is to be understood that many other possible modifications and variations can be made without departing from the spirit and scope of the invention as hereinafter claimed.

What is claimed is:

1. An energy storage system comprising:
an internal battery configured for:
converting an input electrical energy into a stored chemical energy;
converting the stored chemical energy into an output electrical energy;
a motor electrically coupled to the internal battery, wherein motor is configured to be driven, at least in part, by the output electrical energy from the internal battery, wherein the motor is configured for converting electrical energy into mechanical energy;
an alternator rotatably coupled with the motor, wherein the alternator is configured for generating at least a portion of the input electrical energy;
a primary battery configured for:
converting a primary electrical energy into a primary stored chemical energy;
converting the primary stored chemical energy into a primary output electrical energy, wherein the primary battery is electrically coupled to the alternator;
a voltage sensor electrically coupled to the primary battery, wherein the voltage sensor is configured for sensing a voltage level of the primary battery;
a switching device electrically coupled to each of the internal battery and the motor, wherein the switching device configured for controlling electrical connectivity between the internal battery and the motor based on the voltage level of the primary battery;
an electrical interconnect electrically coupled to at least one of the internal battery, the alternator and the primary battery, wherein the electrical interconnect is configured to electrically interface with an electricity consuming device in order to supply electrical energy to the electricity consuming device; and
wherein the motor comprises a plurality of high-torque winch motors configured to provide continuous rotation of the alternator at a predetermined rotational speed, wherein the energy storage system further comprises a v-belt pulley configured to transmit rotatory motion from the plurality of high-torque winch motors to the alternator.

2. The energy storage system of claim 1, wherein the motor comprises a Direct Current (DC) motor.

3. The energy storage system of claim 1, wherein the motor is characterized by a dead-pull capacity of 10,000 lb.

4. The energy storage system of claim 1, wherein the internal battery is configured for generating the output electrical energy at 24 Volts, wherein the primary battery is configured for generating primary output electrical energy at 72 Volts.

5. The energy storage system of claim 1, wherein the alternator comprises a spindled alternator comprising a spindled mass side-loaded with a plurality of alternators; wherein the plurality of alternators is equally spaced, wherein kinetic energy accrued by the plurality of alternators is applied, at least in part, to rotate the spindled alternator in conjunction with a rotatory motion imparted to the spindled alternator by the motor.

6. The energy storage system of claim 5, wherein the alternator further comprises a plurality of sprockets corresponding to the plurality of alternators, wherein the plurality of sprockets is configured for transmitting rotatory motion among the plurality of alternators.

7. The energy storage system of claim 5, wherein at least one first alternator of the plurality of alternators is configured for generating the portion of the input electrical energy, wherein at least one second alternator of the plurality of alternators is configured for charging the primary battery.

8. The energy storage system of claim 5, wherein each of the plurality of alternators comprises a single-wire alternator.

9. The energy storage system of claim 5, wherein each of the plurality of alternators comprises a voltage regulator configured to regulate an output voltage of a corresponding alternator of the plurality of alternators.

10. The energy storage system of claim 5, wherein the spindled alternator is configured for generating rotational motion characterized by 750 rpm.

11. The energy storage system of claim 1, wherein the alternator is configured for generating electrical energy characterized by an amperage of at least 150 Amps and a rotational motion of at least 6,000 rpm.

12. The energy storage system of claim 1, wherein the switching device is configured for:
   electrically connecting the motor to the internal battery based on the voltage level falling below a predetermined lower limit in order to operate the motor; and
   electrically disconnecting the motor from the internal battery based on the voltage level exceeding a predetermined upper limit in order to stop operation of the motor.

13. The energy storage system of claim 1, wherein the motor comprises a winch motor.

14. The energy storage system of claim 1, wherein the motor comprises a hydraulic motor.

15. The energy storage system of claim 1, wherein the alternator comprises a spindled alternator and a plurality of secondary alternators mounted on the spindled alternator, wherein at least one first alternator of the plurality of secondary alternators is configured for generating the portion of the input electrical energy, wherein at least second alternator of the plurality of secondary alternators is configured for charging the primary battery.

16. A battery system to continuously output electricity between a predetermined lower limit and a predetermined upper limit, the battery system comprising:
   a primary battery configured for generating electricity at the predetermined upper limit
   a secondary battery configured for generating electricity at predetermined lower limit;
   a high-torque direct current winch motor configured for generating rotational motion based on electrical energy, wherein the high-torque direct current winch motor is electrically coupled to the secondary battery for receiving the electrical energy;
   a spindled alternator rotationally coupled to the high-torque direct current winch motor, wherein the spindled alternator comprises a plurality of alternators configured for generating electrical energy based on rotational motion, wherein the spindled alternator is configured for rotating at a predetermined rotational speed, wherein at least one alternator of the plurality of alternators is electrically coupled to the secondary battery for charging the secondary battery, wherein the spindled alternator comprises a side-loaded spindled mass mounted with four equally spaced alternators, wherein once spindled alternator is set into the rotational motion, the kinetic energy accrued by the plurality of alternators is applied to the energy required to continuously rotate the spindled alternator at the predetermined rotational speed;
   a voltage sensor electrically coupled to the primary battery, wherein the voltage sensor is configured for sensing a voltage level of the primary battery;
   a switching device electrically coupled to each of the internal battery and the high-torque direct current winch motor, wherein the switching device is configured for controlling electrical connectivity between the internal battery and the high-torque direct current winch motor based on the voltage level of the primary battery; and
   an electrical interconnect electrically coupled to at least one of the internal battery, the alternator and battery, wherein the electrical interconnect is configured to electrically interface with an electricity consuming device in order to supply electrical energy to the electricity consuming device.

17. The battery system of claim 16, wherein the predetermined lower limit is 54 volts, the predetermined upper limit is 72 volts and wherein the predetermined rotational speed is 750 rpm.

18. The battery system of claim 16, wherein the at least one alternator of the plurality of alternators electrically coupled to the secondary battery comprises a single alternator.

19. The battery system of claim 16, wherein the spindled alternator further comprises a plurality of sprockets corresponding to the plurality of alternators, wherein the plurality of sprockets is configured for transmitting rotatory motion among the plurality of alternators.

* * * * *